United States Patent
Campbell et al.

(10) Patent No.: US 11,901,915 B1
(45) Date of Patent: Feb. 13, 2024

(54) QUANTUM COMPUTING DECODER AND ASSOCIATED METHODS

(71) Applicant: River Lane Research Ltd., Cambridge (GB)

(72) Inventors: Earl Terence Campbell, Cambridge (GB); Luka Skoric, Cambridge (GB)

(73) Assignee: RIVERLANE LTD., Cambridge (GB)

( * ) Notice: Subject to any disclaimer, the term of this patent is extended or adjusted under 35 U.S.C. 154(b) by 0 days.

(21) Appl. No.: 17/932,837

(22) Filed: Sep. 16, 2022

(51) Int. Cl.
*H03M 13/15* (2006.01)
*H03M 13/00* (2006.01)
*G06N 10/70* (2022.01)

(52) U.S. Cl.
CPC .......... *H03M 13/159* (2013.01); *G06N 10/70* (2022.01); *H03M 13/611* (2013.01)

(58) Field of Classification Search
CPC ... H03M 13/159; H03M 13/611; G06N 10/70
See application file for complete search history.

(56) References Cited

U.S. PATENT DOCUMENTS

| | | | |
|---|---|---|---|
| 2020/0119748 A1* | 4/2020 | Lucarelli | G06N 10/00 |
| 2021/0194507 A1* | 6/2021 | Delfosse | G06N 10/00 |

OTHER PUBLICATIONS

Iyengar et al. "Windowed decoding of protograph-based LDPC convolutional codes over erasure channels." IEEE Transactions on Information Theory 58.4 (2011): 2303-2320.
Huang et al. "Between Shor and Steane: A unifying construction for measuring error syndromes." Physical review letters 127.9 (2021): 090505.
Dennis et al. "Topological quantum memory." Journal of Mathematical Physics 43.9 (2002): 4452-4505.
International Search Report and Written Opinion for International Application No. PCT/GB2023/052393 dated Dec. 8, 2023, 20 pgs.
Das Poulami Poulami@Gatech Edu et al, "LILLIPUT: a lightweight low-latency lookup-table decoder for near-term Quantum error correction" , Proceedings of the 41st IEEE/ACM International Conference on Computer-Aided Design, ACMPUB27, New York, NY, USA, Feb. 28, 2022, pp. 541-553.

(Continued)

*Primary Examiner* — Thien Nguyen
(74) *Attorney, Agent, or Firm* — MASCHOFF BRENNAN

(57) ABSTRACT

A computer-implemented method for decoding syndromes of a quantum error correction code, the syndromes comprising measurement data from a quantum computer, the method comprising: receiving syndrome measurement data comprising a plurality of quantum error correction rounds performed on a plurality of qubits; identifying a plurality of non-overlapping first blocks within the syndrome measurement data, wherein: each first block has: a first central block of quantum error corrections rounds; and a first buffer block of quantum error correction rounds, wherein the first buffer block surrounds the first central block, and each first block is surrounded by an interstitial region of quantum error correction rounds; identifying the location of a first set of errors in the plurality of qubits by decoding each first block to provide respective decoded first central blocks and respective decoded first buffer blocks; outputting the location of the first set of errors contained within each decoded first central block.

20 Claims, 11 Drawing Sheets

(56) References Cited

OTHER PUBLICATIONS

Ryan-Anderson C et al: "Realization of Real-Time Fault-Tolerant Quantum Error Correction", Physical Review X, [Online] vol. 11, No. 4, Dec. 23, 2021, Retrieved from the Internet: URL: https://journals.aps.org/prx/pdf/10.1103/PhysRevX.11.041058 [retrieved on Dec. 7, 2023].

Das Poulami et al: "AFS: Accurate, Fast, and Scalable Error-Decoding for Fault-Tolerant Quantum Computers", 2022 IEEE International Symposium on High-Performance Computer Architecture (HPCA), IEEE, Apr. 2, 2022 (15 Pages).

Varsamopoulos Savvas et al: "Decoding surface code with a distributed neural network-based decoder", Quantum Machine Intelligence, [Online] vol. 2, No. 1, Feb. 6, 2019, Retrieved from the Internet: URL: https://arxiv.org/pdf/1901.10847.pdf> [retrieved on Dec. 6, 2023].

Luka Skoric et al: "Parallel window decoding enables scalable fault tolerant quantum computation", arxiv.org, Cornell University Library, 201 Olin Library Cornell University Ithaca, NY 14853, Sep. 18, 2022, XP091322107, pp. 1-12.

Xinyu Tan et al: "Scalable surface code decoders with parallelization in time", arxiv.org, Cornell University Library, 201 Olin Library Cornell University Ithaca, NY 14853, Sep. 19, 2022.

\* cited by examiner

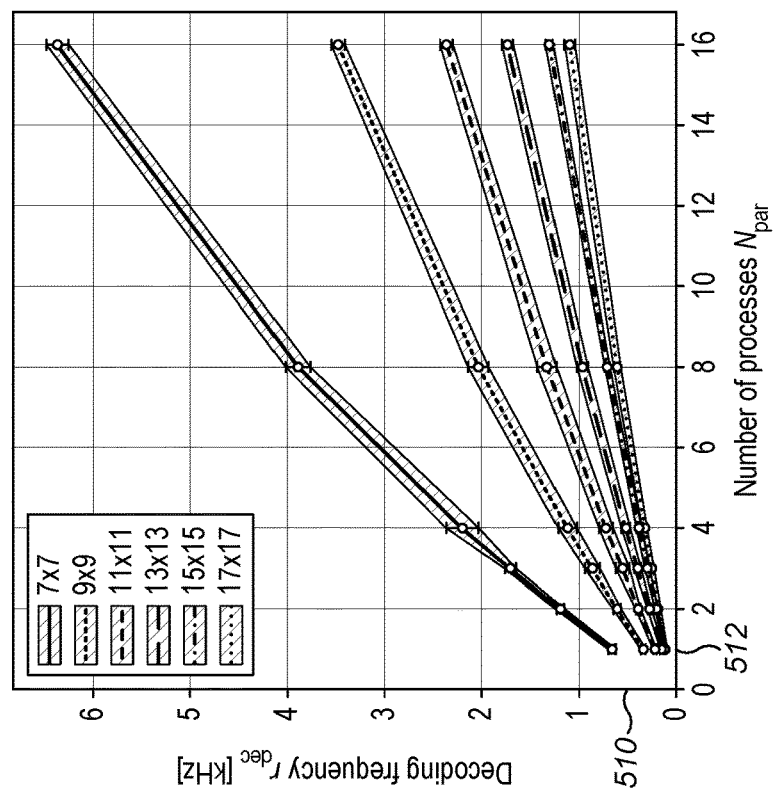
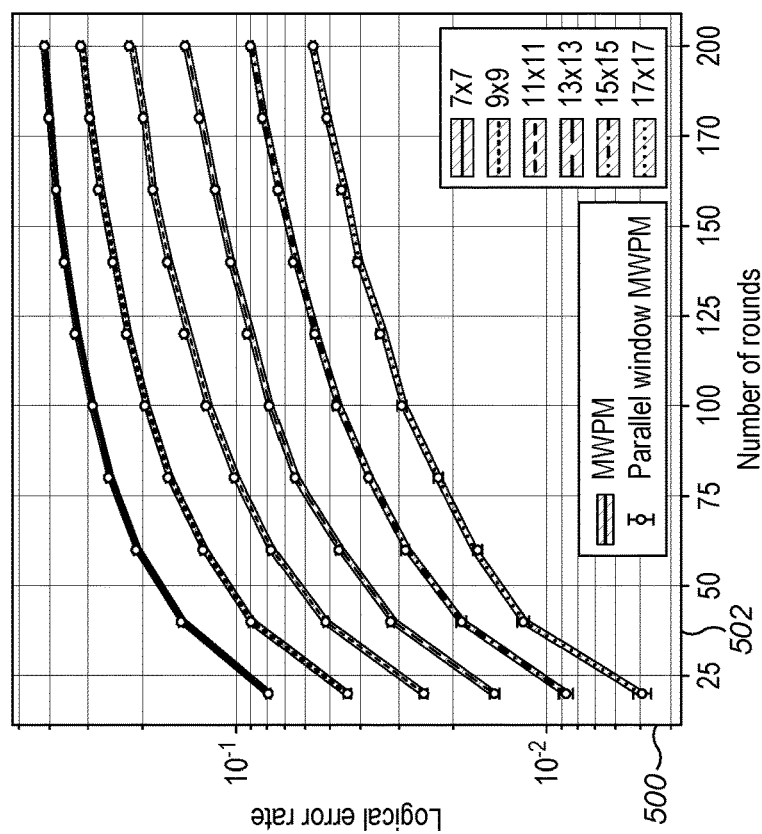
FIG. 5b
FIG. 5a

QUANTUM COMPUTING DECODER AND ASSOCIATED METHODS

BACKGROUND

The present disclosure relates to apparatus, systems and methods for decoding syndromes of a quantum error correction code.

SUMMARY

According to a first example embodiment, there is provided a computer-implemented method for decoding syndromes of a quantum error correction code, the syndromes comprising measurement data from a quantum computer, the method comprising:
  receiving syndrome measurement data comprising a plurality of quantum error correction rounds performed on a plurality of qubits;
  identifying a plurality of non-overlapping first blocks within the syndrome measurement data, wherein:
    each first block has:
      a first central block of quantum error corrections rounds; and
      a first buffer block of quantum error correction rounds, wherein the first buffer block surrounds the first central block, and
    each first block is surrounded by an interstitial region of quantum error correction rounds;
  identifying the location of a first set of errors in the plurality of qubits by decoding each first block to provide respective decoded first central blocks and respective decoded first buffer blocks;
  outputting the location of the first set of errors contained within each decoded first central block.

Optionally, two or more of the first blocks may be decoded in parallel.

Optionally, it may be possible to identify the location of a second set of errors in the plurality of qubits by decoding a plurality of second blocks, wherein each second block comprises:
  a first interstitial block of the interstitial region; and
  at least part of the decoded first buffer block of each first block immediately adjacent to the interstitial block; and
  outputting the location of the second set of errors contained within each second block.

Optionally, two or more of the second blocks may be decoded in parallel.

Optionally, the plurality of first central blocks together with the plurality of second blocks provide a tessellation of the quantum error correction code.

Optionally, each first buffer block may comprise at least a number of quantum error correction rounds, between an adjacent first central block and an adjacent first interstitial block, at least equal to half a code distance of the quantum error correction code.

Optionally, the second blocks may further comprise second buffer regions that extend into adjacent second interstitial blocks of the interstitial region, wherein nearest neighbour second blocks are separated by the second interstitial blocks.

Optionally, a second central block of each respective second block may comprise the respective first interstitial block and the at least part of the decoded first buffer block of each first block immediately adjacent to the respective interstitial block, each second central block being surrounded by each immediately adjacent first central block and the second buffer regions; and the second set of errors may be contained within each second central block.

Optionally it may be possible to identify locations of a third set of errors by decoding the second interstitial blocks; and outputting the locations of the third set of errors.

Optionally, the plurality of first central blocks, the plurality of second central blocks and the plurality of second interstitial blocks, may together provide a tessellation of the quantum error correction code.

Optionally, the tessellation of the quantum error correction code may be three-colorable, such that:
  zero pairs of the first central blocks share a boundary;
  zero pairs of the second central blocks share a boundary; and
  zero pairs of the second interstitial blocks share a boundary.

Optionally, each first central block may be a regular hexagon and the plurality of first central blocks may form a first regular hexagonal array.

Optionally, each second central block may be a regular hexagon and the plurality of second central blocks may form a second regular hexagonal array.

Optionally, each second interstitial block may be a regular hexagon and the plurality of second interstitial blocks may form a third regular hexagonal array.

Optionally, the plurality of first central blocks, the plurality of second central blocks and the plurality of second interstitial blocks may provide a three-colorable tiling of a two-dimensional boundary of the quantum error correction code.

Optionally, each of the plurality of first central blocks, each of the plurality of second central blocks and each of the plurality of second interstitial blocks may extend from the boundary in a third orthogonal dimension to provide a three-colorable tessellation of the quantum error correction code.

Optionally, it may be possible to identify the location of a third set of errors in the plurality of qubits by decoding a plurality of third blocks, wherein each third block comprises:
  a respective second interstitial block of the interstitial region; and
  at least part of the decoded buffer region of each second block immediately adjacent to the respective second interstitial block; and
  outputting the location of the third set of errors contained within each third block.

Optionally, the third blocks may further comprise third buffer regions that extend into adjacent third interstitial blocks of the interstitial region, wherein nearest neighbour third blocks are separated by the third interstitial blocks;

Optionally, a third central block of each respective third block may comprise the respective second interstitial block and the at least part of the decoded buffer region of each second block immediately adjacent to the respective second interstitial block, each third central block being surrounded by each immediately adjacent first central block and second central block and the third buffer regions;

Optionally, the third set of errors may be contained within each third central block.

Optionally, it may be possible to identify locations of a fourth set of errors by decoding the third interstitial blocks; and outputting the locations of the fourth set of errors.

Optionally, the plurality of first central blocks, the plurality of second central blocks, the plurality of third central blocks and the plurality of third interstitial blocks, may together provide a four-colorable tessellation of the quantum error correction code.

According to another embodiment, there is provided an apparatus for decoding syndromes of a quantum error correction code, the apparatus comprising:
a plurality of block decoders;
a process manager configured to:
   receive syndrome measurement data comprising a plurality of quantum error correction rounds performed on a plurality of qubits of a quantum computer;
   identify a plurality of primary blocks of the syndrome measurement data, wherein neighbouring primary blocks are separated by interstitial blocks of quantum error correction rounds, each primary block comprising:
      a first central block of quantum error corrections rounds; and
      a first buffer block of quantum error correction rounds, wherein the first buffer block surrounds the first central block;
   provide each one of the primary blocks to a respective block decoder of the plurality of block decoders and each one of the interstitial blocks to a respective block decoder of the plurality of block decoders,
wherein each respective block decoder provided with a respective primary block is configured to:
   identify the location of errors in the plurality of qubits by decoding the respective primary block to provide a respective decoded first central block and a respective decoded first buffer block;
   provide the location of the errors in the respective decoded first central block to an output;
   provide at least a first part of the respective decoded first buffer block to the respective block decoder with the particular interstitial block immediately preceding the respective primary block;
   provide at least a second part of the decoded first buffer block to the respective block decoder with the particular interstitial block immediately succeeding the respective primary block.

Optionally, each respective block decoder provided with a specific interstitial block may be configured to:
combine the specific interstitial block with the provided first part of the respective decoded first buffer block and the provided second part of the respective decoded first buffer block to form a respective secondary block;
identify the location of further errors in the plurality of qubits by decoding the respective secondary block;
provide the location of the further errors to the output.

Optionally, a quantum computer system may comprise any apparatus disclosed herein.

According to another embodiment, there is provided an apparatus configured to perform any method disclosed herein.

According to another embodiment, there is provided a computer program product comprising instructions configured to perform the method of any disclosure herein on a quantum computer.

BRIEF DESCRIPTION OF THE DRAWINGS

Example embodiments of the present invention will now be described in detail with reference to the accompanying drawings, in which:
FIG. 5 shows an example embodiment of data illustrating the performance of a parallel window decoding method.

DETAILED DESCRIPTION

Quantum Error Correction (QEC) continuously generates a stream of syndrome data that contains information about the errors in a quantum computer's system of qubits. Useful fault-tolerant quantum computation will require online decoders that are capable of processing this syndrome data at the rate it is received. Otherwise, a data backlog is created that grows exponentially with the T-gate depth of the computation. Superconducting quantum devices can perform QEC rounds in sub-1 µs time, setting a stringent requirement on the speed of the decoders. All current decoders have a maximum code size beyond which the processing of syndromes becomes too slow to keep up with the data acquisition, thereby making the fault-tolerant computation not scalable. This disclosure presents a new method that parallelizes the decoding problem and achieves almost arbitrary syndrome processing speed. The parallelization requires some classical feedback decisions to be delayed, leading to a slow-down of the logical clock speed. However, the slow-down is polynomial in code size and so an exponential backlog is averted. Furthermore, using known auto-teleportation gadgets the slow-down can be eliminated altogether in exchange for increased qubit overhead, with polynomial scaling. The parallelization speed-up is evidenced using a Python implementation combining it with union-find and alternatively with minimum-weight perfect-matching decoding. Furthermore, it is shown that the method imposes no noticeable reduction in logical fidelity compared to the original global decoder. Means of implementing the new method in online hardware decoders is also disclosed.

Fault-tolerant quantum computation is a set of protocols that enables execution of a quantum algorithm with arbitrarily high success probability using physical operations with much lower fidelities. A requirement is that the physical operations are below the relevant error correction threshold, which for a surface code architecture is just below 1% for depolarizing circuit-level noise models.

Quantum error correction (QEC) generates a stream of syndrome data to be decoded. An offline decoder collects and stores all the syndrome data generated during a hardware run (often called a shot) and then performs decoding as a post-processing step. Offline decoding is sufficient for a single logical qubit with no logic gates performed and computations consisting solely of Clifford gates. However, fault-tolerant quantum computations must adaptively change in response to certain logical measurement results, which must be decoded to be reliable. For instance, when performing T gates using teleportation and a magic state, it must be determined whether to apply a Clifford S correction before performing the next non-Clifford operation which constitutes a logic branching.

Figure 1:
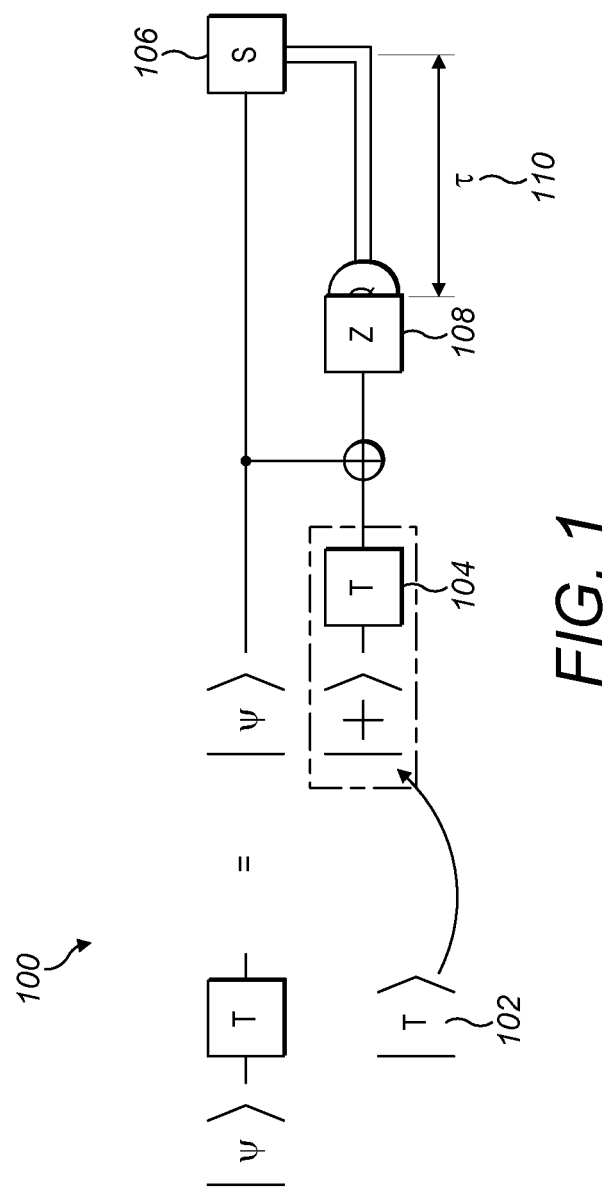
FIG. 1 shows an example of a gate-teleportation circuit configured to perform a T gate.

FIG. 1 shows a gate-teleportation circuit 100 configured to perform a T gate 104 using a magic state $|T\rangle := T|+\rangle$ 102, including a classically controlled S gate 106 depending on the measurement outcome. In fault tolerant implementations with logical qubits, the logical Z 108 measurement must be decoded before the S correction can be correctly applied, this leads to a response time r 110 that is largely determined by the decoding time but also includes communication and control latency.

The correct logic branching decision can only be reliably made after decoding the syndrome data from the T gate teleportation. Therefore, online, or real-time, decoding is necessary for useful quantum computation of any kind. Classical computation occurs at finite speed, so online decoders will have some latency, but they need only react fast enough to enable feed-forward and Clifford correction. This disclosure provides detailed information about precisely what fast enough online decoding truly means and provides new methods of achieving this objective.

To date, all hardware demonstrations of quantum error correction have fallen short of (unambiguously) achieving logical lifetimes better than physical lifetimes, though several have come close. Improving on physical lifetimes through quantum error correction is widely regarded as the next big technological milestone toward utility scale quantum computing and is tantalizingly close to fruition. Many of the required components and operations have been demonstrated together, albeit with noise levels slightly above pseudo-threshold.

For instance, it is possible to perform error correction using a color code (also known as the Steane code) in a trapped-ion quantum computer and even perform online look-up table decoding. However, trapped-ion devices are relatively slow, completing a full QEC round every approximately 200 ms. On these time scales, decoding is less challenging. Superconducting devices are much faster. It is possible to perform superconducting device QEC rounds every 1.1 µs and in other examples every 921 ns. At this pace, online decoding becomes challenging or even impossible, so offline decoding is used instead, thereby failing to provide a crucial aspect of scalable quantum error correction.

A fast online decoder can be provided using an FPGA-based look-up table combined with a sliding window method. For $d \leq 5$ surface codes, a round of syndrome data could be processed every 300 ns, comfortably below the current targets. However, lookup tables are problematic because they are not scalable. Alternatively, a microarchitecture union find decoder might be fast enough for distance 11 surface codes. However, this assumes a phenomenological noise model and accounting for realistic noise could further slow the decoder. Additionally, there is risk of modelling inaccuracies further study is necessary to confirm the validity of this approach in a real device. A parallelized version of MWPM has never before been implemented and its performance is unclear.

How fast do decoders need to be? It has been observed that if $r_{proc}$ is the rate (in bauds) at which syndrome bits are processed and $r_{gen}$ is the rate at which these syndrome bits are generated, then if $r_{gen}/r_{proc}=f>1$, a small initial backlog in processing syndrome data will lead to an exponential slow down during the computation, preventing quantum computers from providing real-world utility.

It can be proved that proved that quantum algorithms with T-depth k have a running time lower bounded by $cf^k$ when $f>1$ and c is some constant.

A million physical qubit device performing quantum error correction round every 1 µs, would generate $r_{gen}=1012$ syndrome bits per second. Similar estimates apply to superconducting devices with a million physical qubits which may generate 3.3 Terabytes of syndrome data per second. While these numbers might be slightly reduced by using a sparse representation, online decoders capable of processing at this rate will require significant technological development, including dedicated decoding hardware and maximum classical parallelism.

The majority of theoretical and simulation error correction work on the 2D surface code has developed offline decoders such as minimum weight perfect matching (MWPM), union find, renormalisation, tensor-network and variants of belief propagation. However, some decoders could be modified to work in real time by taking action to remove only long-lived defects, leaving those of more recent vintage to be dealt with in the next recovery step. Here defects refers to observed changes in syndrome. This may be termed an overlapping recovery method. Other approaches are possible for decoding classical LDPC codes, where this is known as sliding window decoding. Roughly, decoding occurs over a window of syndrome data, obtaining a tentative set of error assignments. Then commit error assignments are made to a subset of tentative assignments (those of older vintage). Committing means making a final correction decision for some possible error locations, though with all corrections performed in software. The window can then be slid up the process repeated.

The sliding window approach is inherently sequential. Consider a single code block (e.g. a surface code patch) with each QEC round taking $\tau_{rd}$ seconds. If each window is responsible for committing (resolving) to error corrections over $n_{com}$ rounds of syndrome data, then it takes time $n_{com}\tau_{rd}$ to generate all this data. If the time to decode each window is $\tau_W$, including any communication latency, then avoiding the backlog problem requires that $\tau_W < n_{com}\tau_{rd}$. Since $\tau_W$ typically grows superlinearly with the decoding volume (which is approximately $n_{com}d^2$) for a distance d code, but $\tau_{rd}$ is constant, there will be some code distance beyond which quantum computers can not scale. The present disclosure solves the fundamental technical problem.

Figure 2:
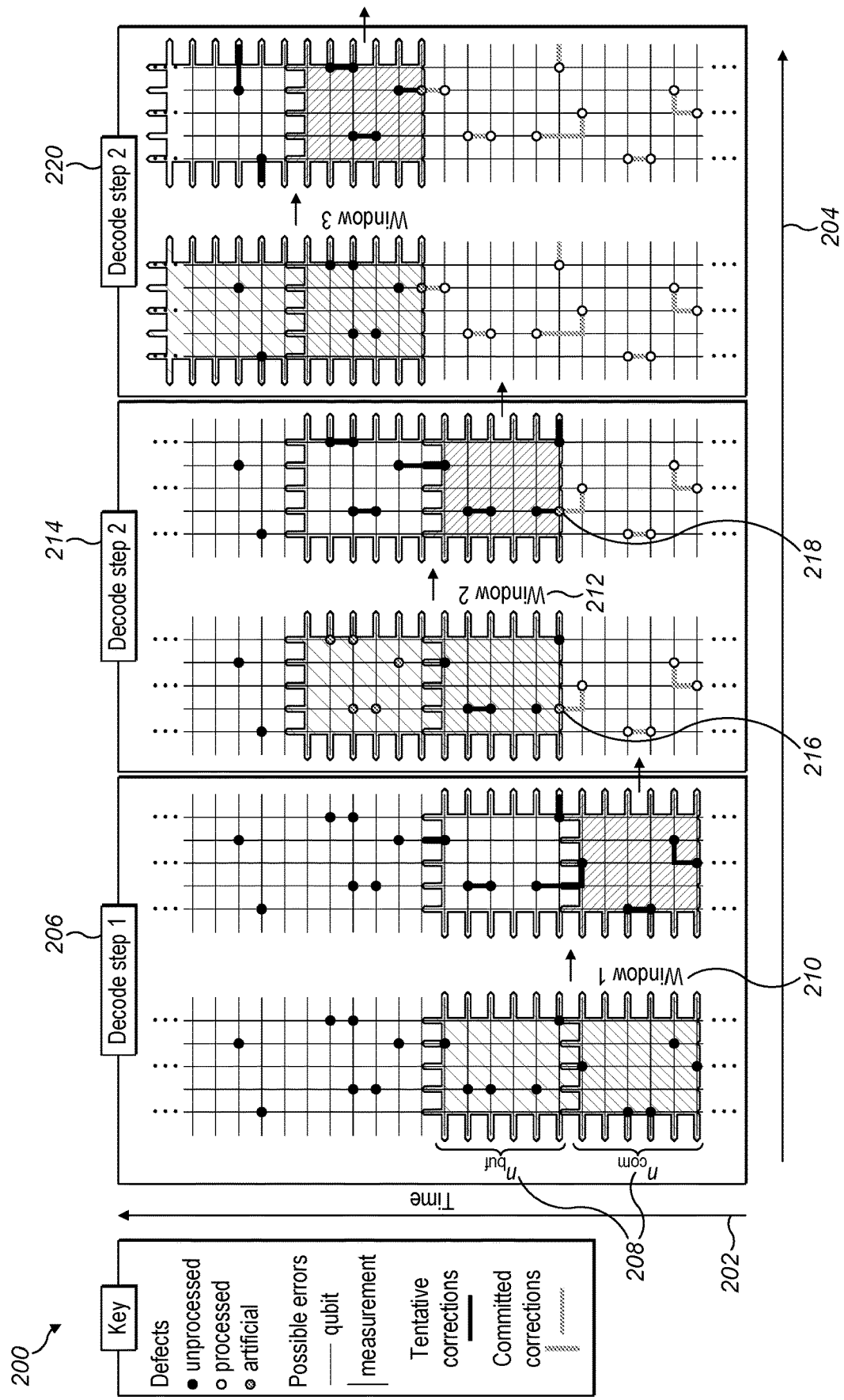
FIG. 2 shows an example of a sliding window decoding method schematically.

FIG. 2 illustrates the sliding window decoding method 200 schematically. At each decoding step a number of syndrome rounds (window) is selected for decoding. The schematic shows time extending along a first direction 202 and the space (within which the qubits reside) extending along a second perpendicular direction 204. A first step 206 of the schematic shows such a first window 208, with tentative corrections acquired. The corrections in the older part of the window 210 are of high confidence and are committed to. The window 212 is then moved up to the edge of the commit region in a second step 214 of the schematic and the decoding process is repeated. Where corrections are committed to the edges going from the commit region out of it, then artificial defects 216, 218 are produced defined by nodes outside of the region belonging to such an edge. The artificial defects 216, 218 can then be resolved and the process repeated again as shown in a third step of the schematic 220. The process can be repeated as many times as necessary. FIG. 2 illustrates sliding window for the simple example of a repetition code, naturally extending to surface codes by adding another spatial dimension which would project out of the plane of the illustration.

In this disclosure, a new parallelized window decoding method that can be combined with any decoder is provided, with MWPM and union-find as specific example decoders. As with sliding window, the decoding problem is broken up into sets of overlapping windows. Rather than solving these decoding problems sequentially, some windows are decoded in parallel. This disclosure adapts how to deal with overlapping windows to make this work. This is confirmed in the numerical results presented herein in relation to FIG. 5, finding that sliding, parallelized and global approaches differ in logical error rates by less than the error bars in the simulations. Unlike sliding window methods, parallel window methods can achieve almost arbitrarily high $r_{proc}$ regardless of decoding time per window $\tau_W$. Furthermore, it is shown that while there is still an inherent latency determined by $\tau_W$, requiring slow-down of the logical clock speed, this is only linear in $\tau_W$, rather than the exponential slow down resulting from the backlog problem that is successfully overcome by this disclosure. Implications for practical decoder requirements and extensions to a number of other decoding problems are also disclosed.

The sliding and parallel window methods can be used with most inner decoders for each window. However, for brevity, disclosure describes the procedure for the case of matching decoders, such as MWPM and union-find. A matching decoder is applicable when any error triggers either a pair of defects or a single defect. For example, in the surface code X errors lead to pairs of defects (when occurring in the bulk) or a single defect (when occurring at so-called rough boundaries of the code).

Instead of decoding a full history of syndrome data after the computation is complete, the sliding window methodology starts decoding the data in sequential steps while the algorithm is running. At each step, a subset (window) of $n_W$ rounds of syndrome extraction is processed. The window correction graph is acquired by taking all the vertices and edges containing defects in the selected rounds. The measurement errors in the final window round only trigger a single defect within the window. Therefore, all final round defects are additionally connected to the boundary defect, referred to as the rough top time boundary.

Following the overlapping recovery method, a window can be divided into two regions: a commit region (which is an example of a first central block) consisting of the "long-lived" defects in the first $n_{com}$ rounds, and a buffer region (which is an example of a first buffer block) containing the last $n_{buf}$ rounds ($n_W = n_{com} + n_{buf}$). An inner decoder (e.g. MWPM or UF) outputs a subset of "tentative" correction edges within the window. Only the correction edges in the commit region are taken as final. Sometimes, the tentative chains of correction edges will cross from the commit to the buffer region. Applying only the part of the chain in the commit region will introduce new defects, referred to as the "artificial defects" along the boundary between the commit and buffer regions.

The window is then moved up by $n_{com}$ for the next decoding step that now includes the artificial defects along with the unresolved defects from the preceding step buffer region and new defects in the successive rounds.

Processing only a subset of the syndrome data at a time inevitably reduces the logical fidelity of the decoder. However, a logical fidelity close to that of the global decoder can be retained by making the unaccounted failure mechanisms negligible compared to the global failure rate. In particular, the error chains beginning in the committed region need to be unlikely (compared to the global failure rate) to span the buffer region and extend beyond the window. If the measurement and qubit error rates are comparable, to achieve this for distance d codes, it is sufficient to make the buffer region of the same size $n_{buf} = d$. Below, it is demonstrated numerically that by choosing $n_{buf} = n_{com} = d$ we see no noticeable increase in logical error rate when applying the sliding window algorithm. In other examples setting the buffer region to one half of d can also provide successful decoding results.

As discussed earlier, there will always be a code size for which $\tau_W > n_{com} \tau_{rd}$, leading to an ever-growing syndrome backlog and an exponential slowdown as the computation progresses. This represents a fundamental technical obstacle to the practical implementation of quantum computing, which applies irrespective of the nature of any problem being addressed by a quantum computer, since all foreseeable quantum computation will require error correction to successfully complete complex computations. The present disclosure provides a general solution to this fundamental problem.

Figure 3:
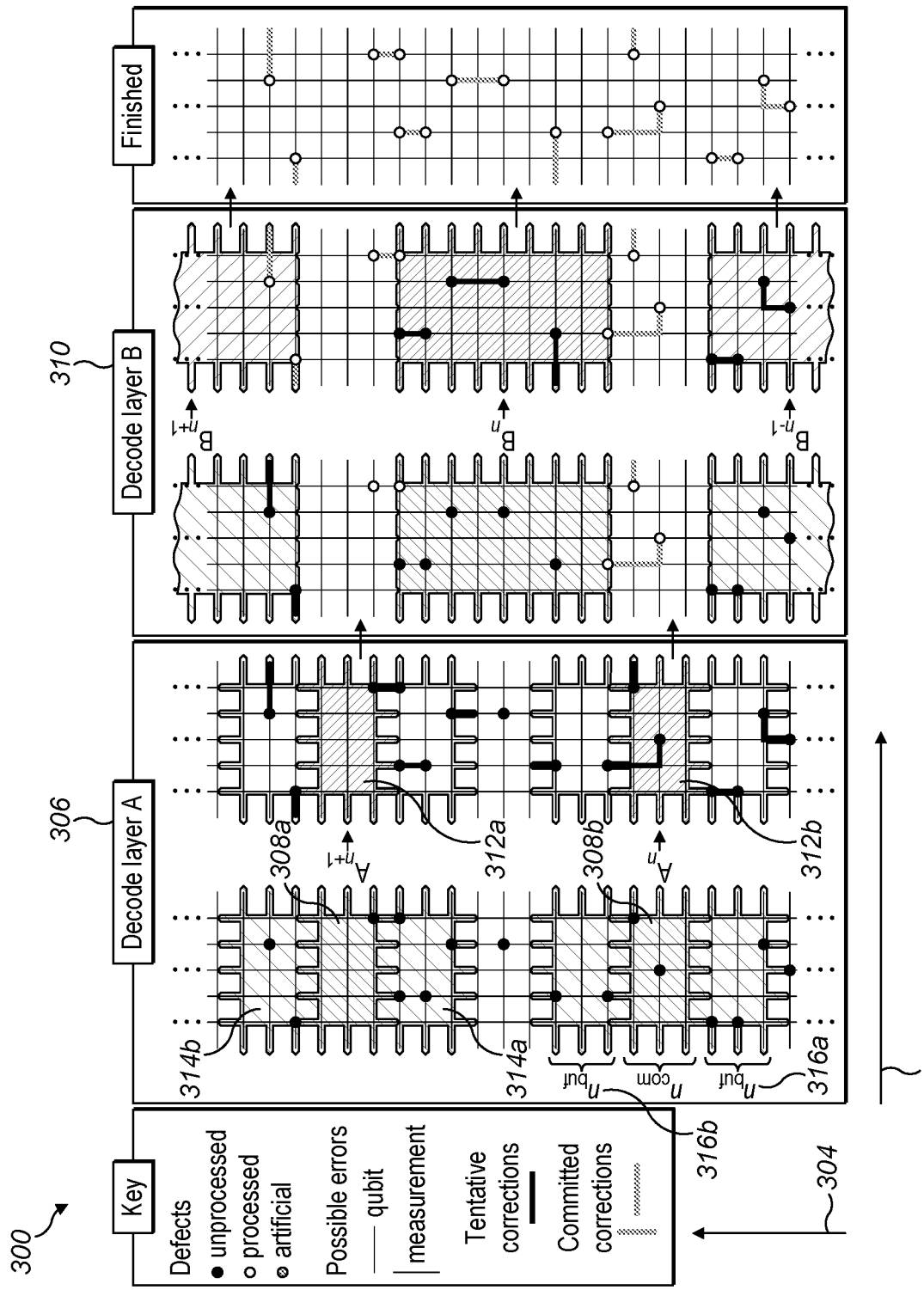
FIG. 3 shows an example embodiment of a parallel window decoding method schematically.

FIG. 3 shows a schematic 300 for a decoding method that can be called the parallel window decoder. The schematic 300 illustrates the method for a simple repetition example, which can be extended to any surface code by extending to a $2^{nd}$ spatial dimension to include syndrome data from a 2-dimensional array. The schematic shows syndrome data from a 1-dimensional array, with the spatial dimension extending along a first direction 302, while the second perpendicular direction 304 corresponds to time. The schematic thus shows a plurality of quantum error correction rounds executed at a successive time intervals in the form of portions of a square graph.

The decoding proceeds In two layers. In layer A 306, a number of non-overlapping windows 308a, 308b are decoded in parallel. The high confidence corrections in the middle of windows are committed to, and the artificial defects passed on to layer B 310. Windows in layer B 310 are fully committed to, resolving all the defects between the committed regions of layer A 312a, 312b and completing the correction.

As opposed to the sliding window approach, there are potentially unprocessed defects preceding the rounds in a layer A 306 window. Therefore, it is a key part of the decoding process to include a buffer region both preceding 314a, 316a and succeeding 314b, 316b the commit regions. We also additionally set both time boundaries to be rough, connecting the first and last round of defects to the boundary node. In this example, $n_{buf} = n_{com} = w$, giving a total of $n_W = 3w$ per window for some constant w. Using the same reasoning as with the sliding window w=d is selected, although it will be appreciated that this is an optional choice. Note that in FIG. 3, w<d is actually shown to keep the illustration compact.

Having committed to corrections in adjacent windows and computed the resulting artificial defects, in layer B 310, the corrections are determined for the rounds between the neighbouring A commit regions 312a, 312b. For convenience, we separate A windows by d rounds, so that B windows also have $n_W = 3d$ rounds, although this is optional. As the corrections preceding and succeeding the rounds in B windows have been resolved in layer A, the B windows have smooth time boundaries and do not require buffers. Crucially, if the size of windows and the commit region in layer A are chosen appropriately, no significant drop in logical fidelity is expected compared to the global decoder. As with sliding windows, this is because each error chain of length d is guaranteed to be fully captured within one of the windows. In relation to FIG. 4 discussed below, this is verified by simulating the decoding process in Python. The logical error rates of rotated planar codes using the global MWPM and parallel window MWPM are within the numerical error of each other across a range of code sizes and number of measurement rounds. The same holds for UF-based decoders with data discussed below.

Secondly, this method is infinitely parallelizable. As soon as the last round of window $A_n$ has been measured, the data can be given to a worker process to decode it. However, as the window $B_n$ requires the artificial defects generated by windows $A_n$ and $A_{n+1}$ adjacent to it, it can only start once both processes have completed. Below, in relation to FIG. 9, we discuss a schematic defining how the data pipelining could be implemented in an online parallel window decoder to achieve a full utilization of available decoding cores.

Assuming no parallelization overhead, the syndrome throughput will scale linearly with the number of parallel processes $N_{par}$. In this case, $N_{par}n_{com}$ rounds are committed to in layer A, and $N_{par}n_W$ in layer B, taking on average time $2\tau_W$. Therefore, to avoid the backlog problem, the number of processes needs to be:

$$N_{par} = \left\lceil \frac{2\tau_W}{(n_{com} + n_W)} \tau_{rd} \right\rceil. \quad (1)$$

In practice, the overhead of data communication among worker processes needs to be considered. In the parallel window method, each process only needs to receive defect data before it is started, and return the artificial defects and the overall effect of the committed correction on the logical operators. Thus, the data communication overhead can be negligible compared to the window decoding time. Indeed, in relation to FIG. 4 this is demonstrated by simulating parallel window decoding in Python using MWPM as the inner decoder, showing how using $N_{par}=16$ leads to over an order-of-magnitude increase in decoding speed. Some sub-linearity can be seen due to parallelization overheads in Python, particularly for low-distance codes where the decoding problem is relatively simple. Below, further simulations using UF decoder are disclosed where the overhead is more noticeable due to faster decoding of individual windows. However, hardware decoders, such as FPGA (Field Programmable Gate Array) and ASIC (Application-Specific Integrated Circuit), yield themselves much better to parallel data processing, allowing a large number of processes without being bottle-necked by the communication overheads.

It is possible to achieve almost arbitrarily high syndrome processing rates, but there is still an inherent latency determined by the time to decode each window $\tau_W$. If $\tau_W$ is large compared to the physical QEC round time $\tau_{rd}$, it may be appropriate to slow down the logical clock speed of the quantum computer to compensate for this latency. This slowdown is achieved simply by extending the delay time T as shown in FIG. 1. If we pick $N_{par}$ as described in Equation 1, at every instance, a block of $n_{lag}=N_{par}(n_{com}+n_W)$ rounds are being decoded at once. The last round for which the full syndrome history has been decoded is therefore going to be nag rounds behind the most recently measured syndrome data. Therefore, it is possible to set the response time after each T-gate (as shown in FIG. 1) to $$T = n_{lag}\tau_{rd} = N_{par}(n_{com}+n_W)\tau_{rd} \quad (2)$$

However, combining Equation 1 and Equation 2 the total response time is only $\approx 2\tau_W$. That is, for an algorithm with k layers of T gates, the total response time is $\tau_k \approx 2k\tau_W$. This avoids backlog problem that leads to an exponential in k response time.

Furthermore, using an efficient decoder for each window, the average window decode time $\tau_W$ scales polynomially with code size d, so $\tau_W=O(d^\alpha)$ for some constant $\alpha$. Since code size is poly-logarithmic in algorithm depth k and width W, so $d=O(\log(kW)^\beta)$ for some constant $\beta$. The response time per layer of T-gates is a poly-logarithmic factor so $\tau=O(\log(kW)^{\alpha\times\beta})$. Strictly speaking, this additional overhead increases the decoding volume kW by a logarithmic factor, but overall this still gives a polylogarithmic complexity.

Logical clock time is defined as how long it takes to execute one round of logical operations. Using lattice surgery to perform T-teleportation, and assuming no bias between measurement and physical errors, it takes $d\tau_{rd}$ time for lattice surgery and T response time. This gives a logical clock time of $\tau_{clock}:=d\tau_{rd}+\tau$. Alternatively, this time overhead can be converted into a qubit overhead by using auto-teleportation gadgets to move Clifford corrections into an auxiliary portion of the quantum computer. In algorithm resource analysis, a common assumption is that T gates are performed sequentially as then only few magic-state factories are needed to keep pace. Auto-teleportation gadgets enable performance of the next T-gate before the response time has elapsed. The price is that an auxiliary logical qubit must instead be preserved for time $\tau$, after which they are is measured in a Pauli basis depending on the outcome of the decoding problem. Therefore, instead of a time overhead we can instead add $\lceil \tau/d\tau_{rd} \rceil$ auxiliary logical qubits. If we have an algorithm with 100 logical qubits and $\tau_{clock}=10d\tau_{rd}$, then: without auto-teleportation we incur a 10× time cost; and with auto-teleportation we instead require 9 auxiliary logical qubits and so a 1.09× qubit cost. Under these common algorithm resource assumptions, we find seemingly large time overheads from parallel window decoding can be exchanged for negligible qubit overheads. Indeed, this tradeoff is preferred when optimizing for total space-time volume.

Figure 4:
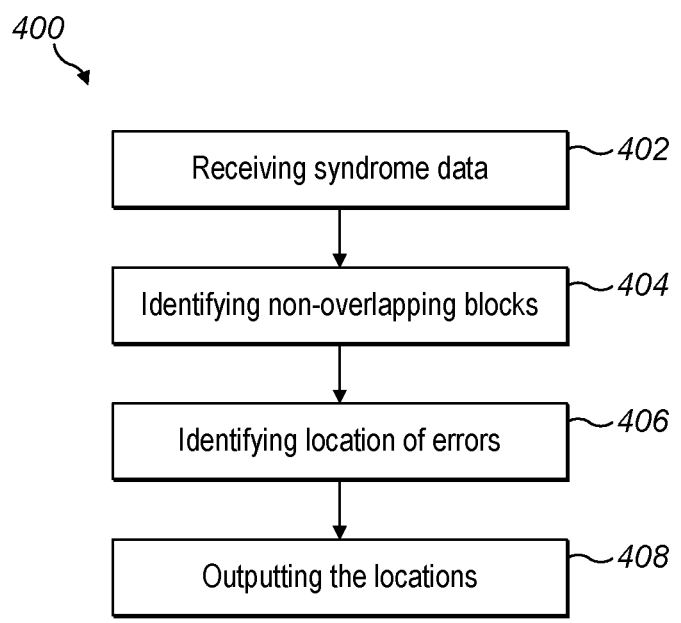
FIG. 4 shows an example embodiment a flow-chart of a method for parallel window decoding.

FIG. 4 shows a flow-chart 400 for a method of decoding the A layers discussed above in relation to FIG. 3. The method begins at a first step 402 with receiving syndrome measurement data at a suitable computing/data processing device. The syndrome measurement data is made up of a plurality of quantum error correction rounds, each round measured at successive time intervals. The rounds measure the state of syndrome qubits within a quantum computer.

At a second step plurality of non-overlapping first blocks are identified within the syndrome data. These first blocks correspond to the non-overlapping windows of FIG. 3. The first blocks are therefore blocks of syndrome measurement data. Each first block has a first central block of quantum error corrections rounds (corresponding the commit regions of layer A discussed above) and a first buffer block of quantum error correction rounds, (which correspond to the buffer regions of layer A discussed above). The first buffer block surrounds the first central block. In this case where windows/blocks parallelize in one dimension only, namely time, each first buffer block is therefore made up of two sub-blocks of syndrome measurement data, one preceding the first central region and one succeeding the first central region. Each first block is also surrounded by an interstitial region of quantum error correction rounds that will not be decoded in the layer A decoding process. Each first block is thereby surrounded by one part of the interstitial region that precedes the first block and one part that succeeds the first block.

At a third step 406, the method identifies the location of a first set of errors in the plurality of qubits by decoding each first block to provide respective decoded first central blocks and respective decoded first buffer blocks. Since, as discussed above, an appropriate choice of the number of error correction rounds surrounding the first central block will ensure that the decoding of the central block will yield reliable results, whereas the decoding of the first buffer block will yield only tentative results. This may be a number of error correction rounds equal to the code distance of the quantum error correction code, or a suitable fraction thereof, such as half the code distance.

The method ends at a fourth step by outputting the location of the first set of errors contained within each decoded first central block, since this is reliable and can be used to perform quantum error correction.

Advantageously, multiple first blocks can be decoded in parallel, although not necessarily all first blocks need be decoded in parallel, depending on the number of blocks and the number of available decoders.

However, before the layer B decoding process can begin for the first interstitial blocks, both the immediately preceding and succeeding first block need to be decoded to provide the tentative error correction information to enable the layer B decoding process to complete. This can be achieved by further method steps in which the location of a second set of errors is determined by decoding second block that are made up of a first interstitial block of the interstitial region, which in this case will extend from the end of a first buffer block before the first interstitial region to the beginning of the next first buffer block that succeeds the first interstitial region. In this example only the part of the decoded first buffer block that is immediately adjacent to the interstitial block is required (and not the sub-block on the other side of the already decoded first central block). Once an entire second block has been decoded, benefiting from the tentative results of decoding the relevant parts of the decoded first buffer blocks, then the location of errors in the second block can be output to joint the first set of errors, which in this 2-dimensional example provides all the information needed to perform quantum error correction.

As above in relation to the first block, multiple second blocks can be decoded in parallel, provided the tentatively decoded first buffer blocks that surround them are available.

It will be appreciated that in higher-dimensional decoding situations, more steps/decoding layers may be required to complete the decoding problem, as discussed in more detail below. However, in this simpler 2-D situation, the first central blocks and the surrounding second blocks will tessellate the quantum error correction rounds in the sense that all relevant syndrome data will belong to exactly one block, with no gaps or overlaps.

FIG. 5 shows logical error rate 500 and decoding frequency 510 on rotated planar code using Minimum Weight Perfect Matching (MWPM) under phenomenological Pauli noise with 2% physical error rate. Logical error rates 500 as a function of the number of rounds of syndrome extraction 502 for different code sizes for both the global offline MWPM (bands), and using the parallel window algorithm (points). The parallel window decoder has no numerically significant drop in logical fidelity compared to the global decoder. The decoding frequency 510 (number of rounds decoded per second) as a function of the number of decoding processes 512 for the parallel window algorithm. The decoding frequency increases approximately linearly with the number of processes, achieving an order of magnitude faster decoding when using 16 processes. The sub-linearity most noticeable on small decoding problems is due to the parallelization overhead in Python. Where the error bars are not visible, they are smaller than the marker size. Here the decoding frequency $r_{dec}$, therefore the rate of syndrome processing is $r_{proc}=r_{dec}(d^2-1)$.

In summary, the present disclosure provides parallel window decoders that can, given enough classical resources, achieve almost arbitrarily high decoding speed. These can be combined with any inner decoder and has no noticeable loss in logical fidelity over a global version of the inner decoder. This comes at a cost of a slowdown of the logical clock speed that is only poly-logarithmic in algorithm size. Furthermore, this time overhead can be traded for an (often negligible) qubit overhead using auto-teleportation gadgets. Ideally, each inner decoder would be inherently fast enough so that sliding window suffices for the code distances required and no overhead is required. However, an advantage of this disclosure is that it shows that even if sliding window decoding is too slow, there is a viable alternative.

For the Python implementation used in the numerical results, the parallel window overheads would be significant (and likely prohibitive) constant factors in the context of large code distances and superconducting devices with QEC cycles shorter than 1 μs. However, combined with hardware accelerated decoders (e.g. FPGA or ASIC technology) these constants factors can be tamed. Therefore, a hardware accelerated parallel window decoding paves the way towards practical and scalable decoding of fault tolerant quantum computation.

The following technical appendices provide implementation details, including for higher dimensional situations than those discussed above in relation to FIGS. 3 and 4.

APPENDIX 1: Methods

All simulations have been performed on AMD EPYC 7742 processor. A PyMatching package was used to perform MWPM. For UF a custom Python implementation of the algorithm was used.

In all experiments, phenomenological Pauli noise with physical error rate p was used, meaning that there is a probability p for a data error on every qubit at each round. Further, every syndrome measurement had an error with probability p.

To compute the timing for FIG. 4 (and FIG. 8 discussed below), decoding on $8(N_{par}+1)d$ rounds was used to ensure a full two cycles of parallel decoding, averaging over 5000 repetitions. Initialisation and readout in the Z basis is assumed, meaning that the initial and final rounds of defects are smooth. Moreover, in parallel window decoding, the first round is always taken to "belong" to layer A, and the first 2d rounds of the first window can be committed to. The last round belongs to a layer B if the total number of rounds $n_{tot}$ satisfies $n_{tot}$ mod $4d \in (-d,d]$, in which case the decoding is performed normally with the last B window potentially being of reduced size. Otherwise, the last window belongs to layer A and the commit region of the last window is from the bottom of the regular commit region to the last round.

APPENDIX 2: WORKING IN HIGHER DIMENSIONS

The phrase "sliding window" appears also in connection with the LDPC code. However, those studies consider just one round of syndrome measurements, and instead the sliding window sweeps spatially over different sets of qubits. By judicious choice of window shapes and boundaries, one could consider 3D-shaped windows that divide the decoding problem in both space and time directions. Similarly, it is possible to construct 3D-shaped windows for parallel execution with only a constant number of layers. When slicing in the time direction only 2 layers of windows are needed, but when constraining window size in D dimensions a D+1 layer construction is possible, with the minimum number of layers being determined by the colorability of some tiling/tessellations). When performing computation by lattice surgery, during merge operations the code temporally has an extended size, and windowing in the spatial direction will become necessary to prevent the window decode time $\tau_W$ from significantly increasing. It is also possible to spatially window during quantum memory with windows smaller than the code distance since the decoder running time $\tau_W$ reduces with window size, and therefore the logical clock speed may decrease (alternatively autoteleportation qubit overhead may reduce). But there are subtle tradeoffs. Firstly, for windows of size $\omega<d$ in either the space or time direction, there may be adversarial failure mechanisms of weight $d/2-1$ that are no longer correctly decoded. It is possible that this reduces the effective code distance to $\omega$. However, in practice, percolation theory arguments show that for a distance d code, the largest error clusters are typically of size $O(polylog(d))$. This leaves open the possibility that windows of size $O(polylog(d))<\omega<d$ will suffice and be of practical value for stochastic (even if not adversarial) noise, though further investigation may be required.

Next, implementation details are provided on how to parallelize in higher dimensions. First, given some space (e.g. a decoding graph or hypergraph) it is possible to divide the space up into non-overlapping commit regions, corresponding to the central blocks discussed above. Formally, each commit region is a set of possible error locations.

Next, a time ordering is imposed on the regions. That is, a set of commit regions is defined to all be resolved in a first batch (corresponding to layer A), a second batch (corresponding to layer B), and so on. When the corrections are performed for some commit region, all the defects on the interior will be resolved, but some defects may remain along the boundary of the commit region. Indeed new artificial defects may even be created along this boundary. Therefore, if two commit regions are resolved in the same batch, it is crucial that they do not push artificial defects into each other and thus must not meet at any point. Formally, given distinct commit regions $A_1$ and $A_2$ in the same layer (A) there must be no defect location (e.g. vertex) such that it can be triggered by both an error in $A_1$ and an error in $A_2$.

Therefore, finding a valid ordering of layers is equivalent to a mathematical coloring problem. That is, we define collections of commit regions and assign them colors, such that no two regions of the same assigned color meet along any boundary, line or point. Given such a coloring, we can map colors to decoding layers, for example red→A, green→B and blue→C. It will be appreciated that no actual visible colors are involved in this computational procedure, but the reference to different regions of space having different 'colors' is a standard mathematical usage. Any permutation of layers remains a valid choice, though other desiderata may provide a preference (e.g. choosing a layer ordering so that it leads to the smallest maximum window size).

He we disclose higher-dimensional parallel window protocols and their relationship to colorability of tessellations (where a tessellation divides up the space occupied by the code in such a way that there are no overlaps or gaps). A 3-color hexagonal tesselation of a 2D space 600 is shown, with each color assigned a layer labelled A, B or C. Note that hexagons of the same color never touch. A protocol (in 2D) based on the hexagonal tiling is shown 610. The central hexagonal portions indicate a commit region and outer hexagonal annular regions that surrounds the commit regions are a buffer regions. Zig-zag edges represent rough boundaries. After a first layer is completed the A commit regions have all their defects resolved, as discussed on more detail below. The hexagonal pattern of 600 is shown extruded into the 3rd dimension 650, so it is suitable for surface code decoding (e.g 2D+1 decoding problems where a 2D array of qubits provide a plurality of error corrections rounds over time).

Figure 6:
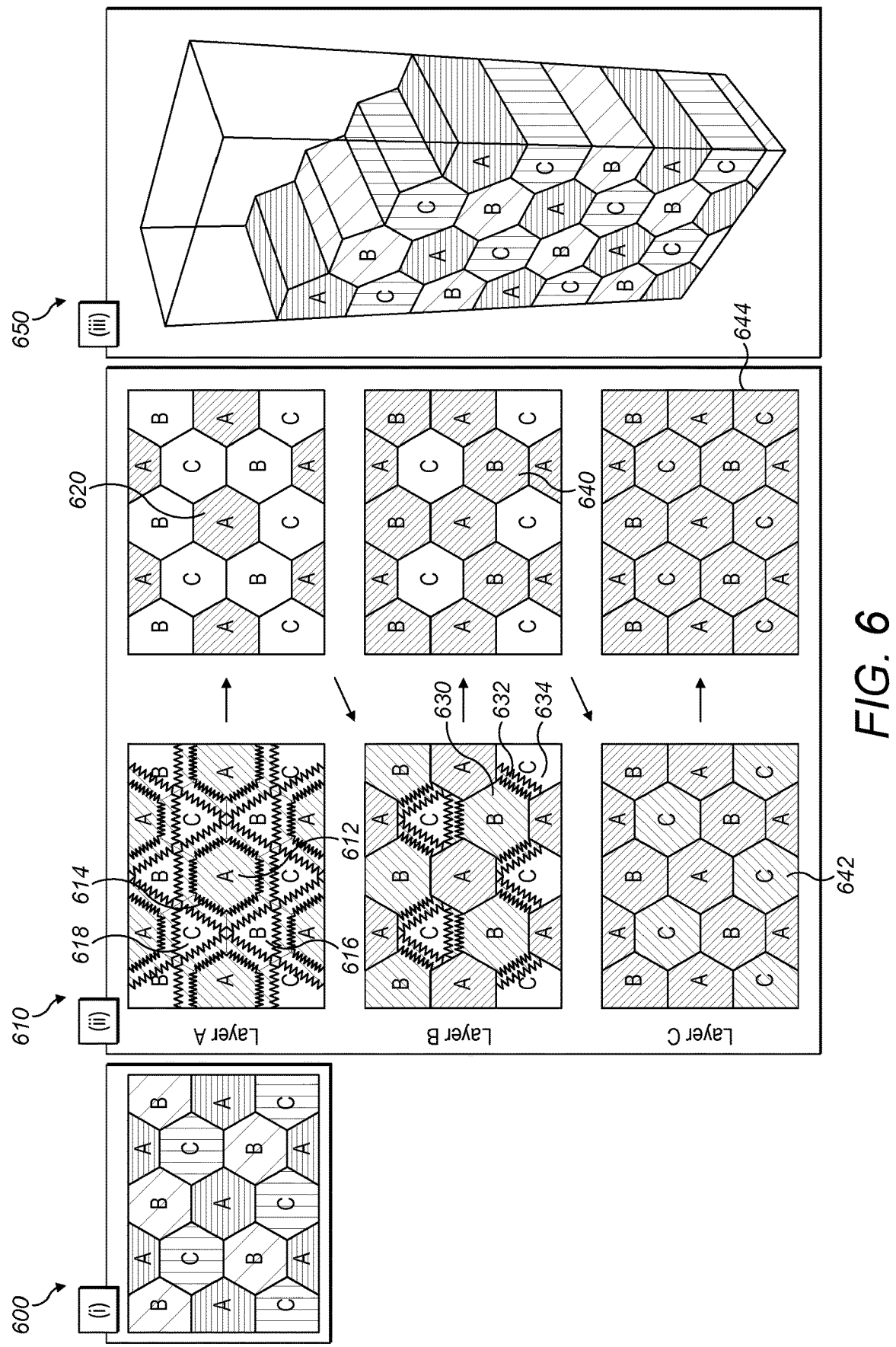
FIG. 6 shows example embodiments of methods for parallel window decoding in 2 and 3 dimensions.

It is well known that tiling a D-dimensional space can always be achieved with a tiling (tessellation) using D+1 colors, with tiles of the same color touching. In FIG. 6, the tiling 650 of the D=3 space is done using only 3 colors, but the regions may be large due to their extent in the $3^{rd}$ dimension.

Our examples show the minimum number of colors. Given a limited number of processors $N_{par}$, we may choose to use more colors so that for each color there are no more than $N_{par}$ regions.

In the example of FIG. 3, the buffer windows were placed above and below the commit region of layer A. In higher dimensions, the buffer regions must extend in all directions away from the commit region, i.e. the buffer must surround the commit region. For a buffer of size w, the buffers must include all possible error locations (edges) within a distance w of the commit region. Distance is measured with respect to weighted edges of the decoding graph. However, previously resolved regions must not be included in the construction of buffers. Additionally, no artificial defects should be pushed into a previously resolved region. Therefore, where a window meets a previously committed region the boundary must be set to smooth (no artificial defects allowed).

For example, FIG. 6. shows how buffer regions and boundaries may operate for a hexagonal tiling 610. In layer A, the buffer region extends in every direction from the commit region. All the boundaries in A are rough. In layer B, the buffer extends in all directions except those already resolved in layer A. Furthermore, the layer B window boundaries are set rough except where they meet the resolved layer A commit regions (where they are instead smooth, as illustrated). The final layer C will only have smooth boundaries and no buffer regions will be required since each block in layer C will be completely surrounded by committed regions.

Considering the hexagonal tiling 610 in more detail, an A layer of first central blocks 612 (which are examples of commit regions) are all marked A. The A layer of first central blocks 612 require a buffer block 614 that completely surrounds them and extends into the blocks of the B layer 616 and the C layer 616. B layer blocks 616 and C layer blocks 618 are examples of interstitial blocks at this point in the decoding process. When the decoding of the first blocks, i.e. the layer A blocks, is complete the layer A blocks 620 have been successfully decoded.

At a second B layer of decoding, the B blocks 630 become second central blocks which require buffer blocks (which can be called second buffer regions) that extend into adjacent interstitial blocks 634 made up of the C layer blocks. When the B layer blocks have been decoded 640 their errors have been successfully located.

In a third C layer of decoding a third set of errors may be located and output for the C layer blocks 642, which may be called second interstitial blocks or third central blocks. Once C layer blocks have been decoded, the location of all errors have been successfully completed 644.

Collectively, the A layer blocks (first central blocks), the B layer blocks (second central blocks) and the C layer blocks (second interstitial blocks, or third central blocks) thus tessellate the quantum error correction code. As discussed above this tessellation of the quantum error correction code is three-colorable, which means that zero pairs of the first central blocks share a boundary, zero pairs of the second central blocks share a boundary and zero pairs of the second interstitial blocks share a boundary. This is achieved in part by each A layer block being hexagonal and the A layer blocks collectively forming a regular hexagonal array. The B and C layer blocks similar form regular hexagonal arrays of regular hexagonal blocks.

Tiling 650 shows how a plurality of first central blocks, a plurality of second central blocks and the plurality of second interstitial blocks, each of which is hexagonal, can provide a three-colorable tiling of a two-dimensional boundary of the quantum error correction code. Each block can then be extended in a direction orthogonal to the boundary to provide a three-colorable tessellation of the quantum error correction code.

If we desire constant size tiles that do not grow too large as may happen using tiling 650, then a tiling of 3D space could be achieved using 4 colors.

Figure 7:
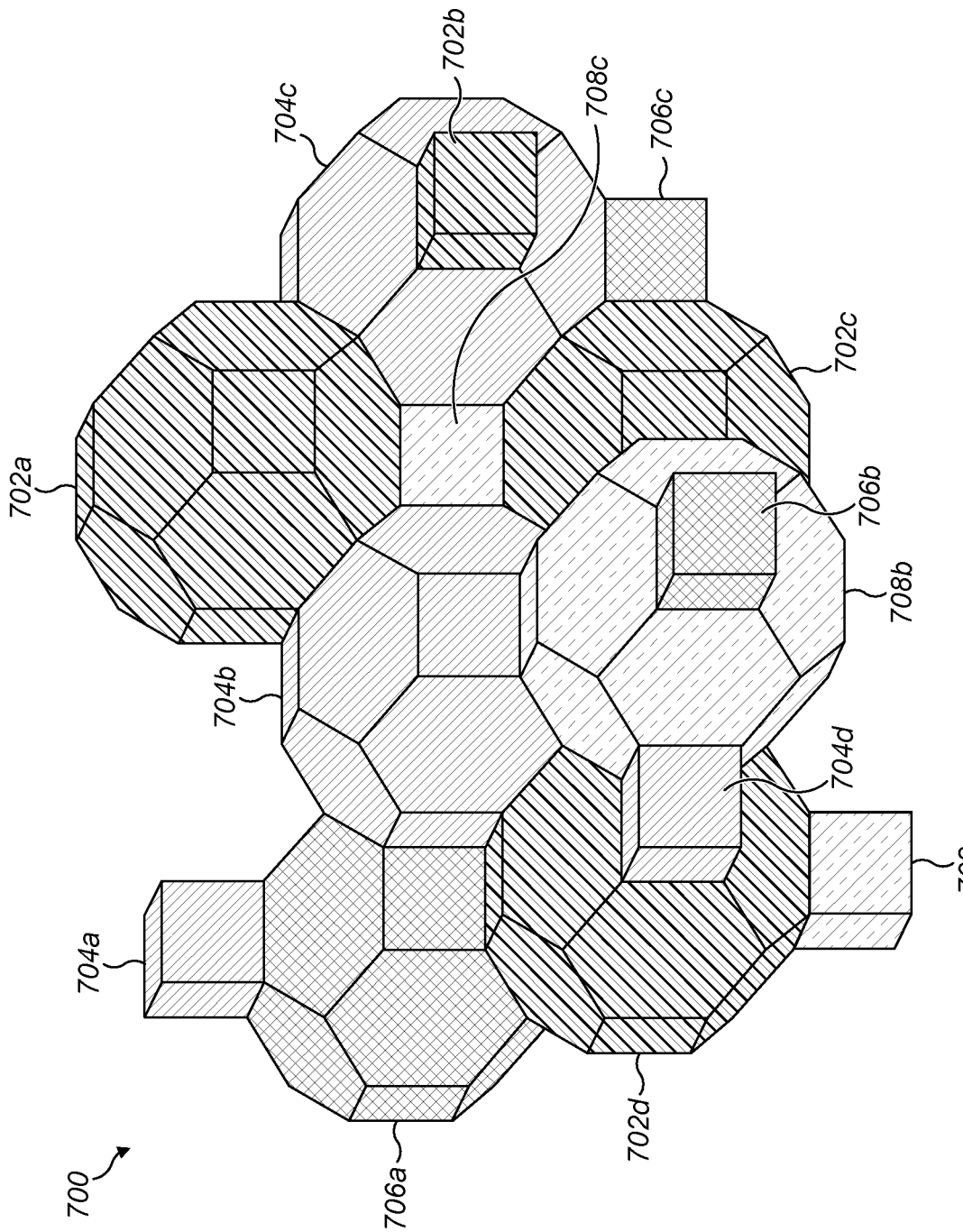
FIG. 7 shows an example embodiment of data illustrating the performance of parallel window decoding methods.
Figure 8B:
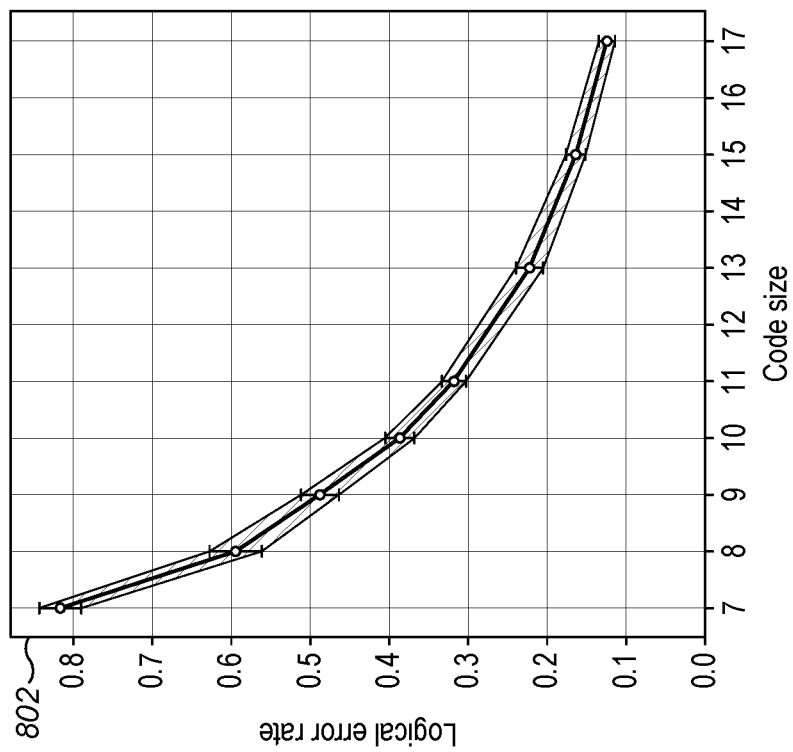
FIG. 8 shows an example embodiment of a method of tessellating 3-dimensional quantum error correction data for performing parallel window decoding methods.
Figure 8A:
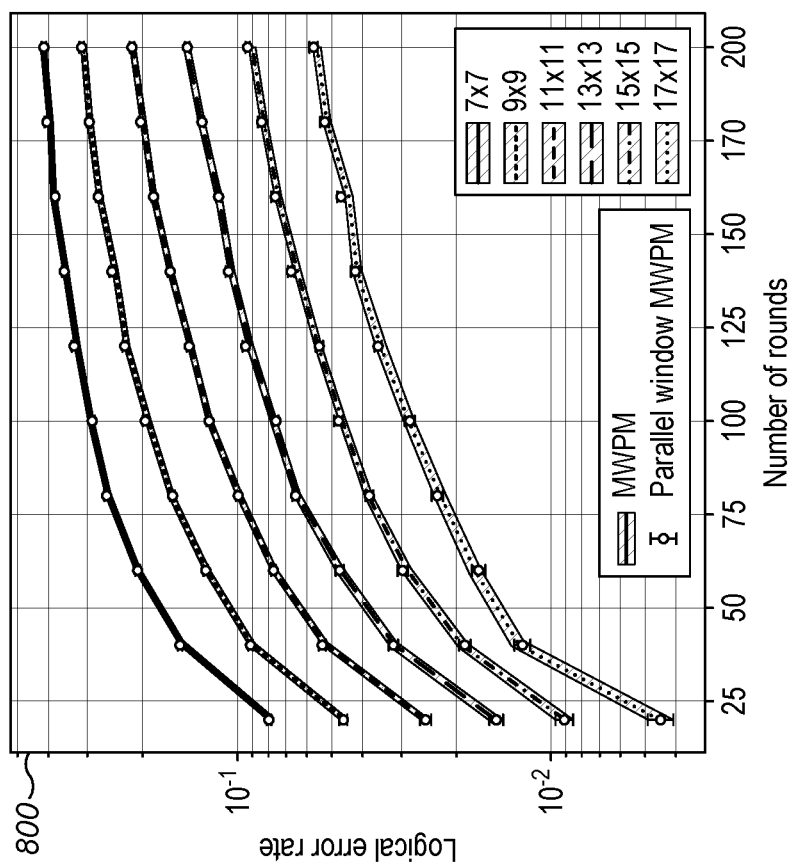
Figure 8D:
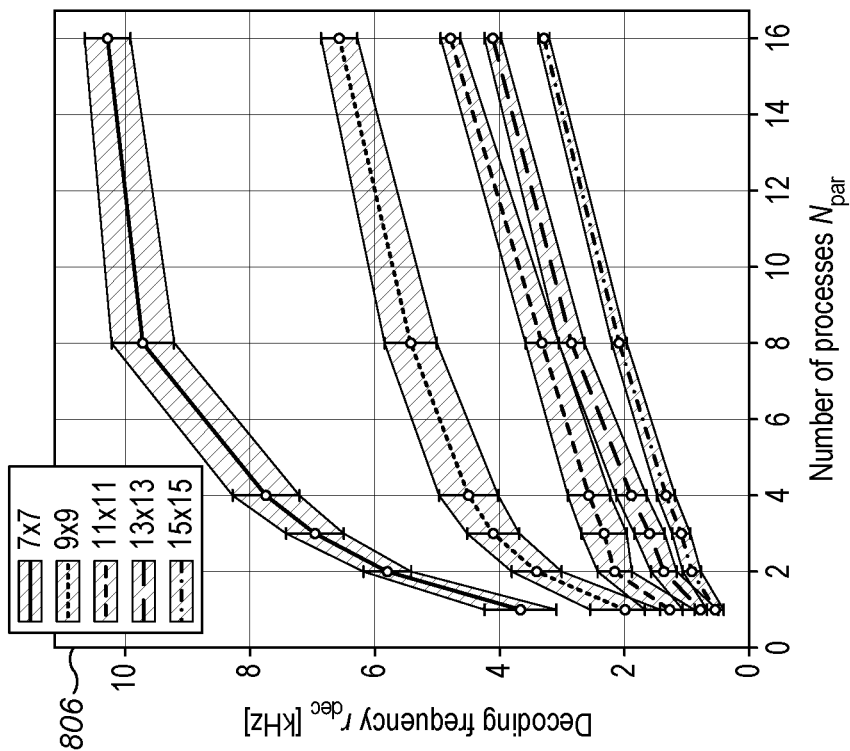
Figure 8C:
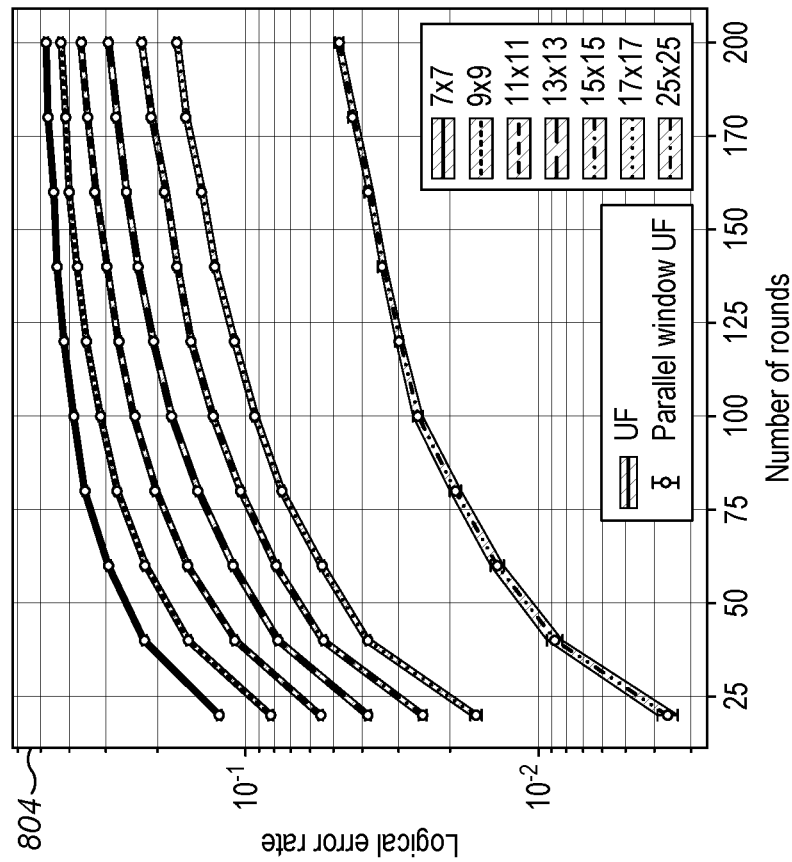

FIG. 7 shows an example of how to tile (or equivalently tessellate) a 3D space 700, which in the case of a surface code will be (2+1)-D space filled with syndrome measurement data, with 2 spatial dimensions and one time dimension.

The 3D tiling 700 has a four-colorable structure with a first layer of blocks 702*a-d*, a second layer of blocks 704*a-d*, a third layer of blocks 706*a-c*, and a fourth layer of blocks 708*a-c*. None of the blocks in any given layer touches any of the other blocks in the same layer, hence this tiling 700 provides a four-colorable tessellation of three dimensional space. It will appreciated by those skilled in the art of mathematical coloring problems that there are other ways to achieve the same effect and the this tiling 700 is provided simply as an example.

A general principle for using the tiling 700 for parallel window decoding is that the first layer of blocks 702*a-d* form a commit region surrounded by un-decoded interstitial space and therefore require a buffer region that surrounds each block 702*a-d* completely. The sum of the first layer of blocks 702*a-d* and their buffer regions then comprise first blocks for decoding in an example of a layer A decoding step. The second layer of blocks 704*a-d* will also require a buffer region that surrounds each block except where they are adjacent to any of the first layer of blocks with respect to which they will have smooth boundaries. Again the combination of the second layer of blocks 704*a-d* and their buffer regions then become second blocks for decoding in a layer B decoding step.

Third blocks are then made by combining the third layer of blocks 706*a-c* (which are examples of third central blocks) together with their buffer regions that extend into adjacent third interstitial blocks of the interstitial region where the third layer of blocks 706*a-c* do not share boundaries with either of the decoded first layer of blocks 702*a-d* or the second layer of blocks 704*a-d*. Nearest neighbour third blocks will be separated by third interstitial blocks such that their respective buffer regions do not come into contact.

Third central blocks also comprises at least part of the decoded buffer region of each second block immediately adjacent to them. Each third central block is thus surrounded by each immediately adjacent (decoded) first central block and (decoded) second central block and the third buffer regions. This enables the location of a third set of errors contain inside the third central block when a layer C decoding step is complete.

The fourth layer of blocks (which can be called either fourth central blocks or third interstitial blocks) will be each completely surrounded by decoded blocks and therefore do not require any buffer region. They can be decoded in a fourth and final layer D decoding step to identify the final fourth set of error required to complete the decoding process.

The first layer of blocks (first central blocks), second layer of blocks (second central blocks), the third layer of blocks (third central blocks) and the fourth layer of blocks (third interstitial blocks), together provide a four-colorable tessellation of the quantum error correction code such that all parts of the code belong in exactly one block.

APPENDIX 3: FORMALISM FOR A GENERAL FRAMEWORK

Error mechanisms (e.g. bulk Y errors in the surface code) sometimes trigger more than a pair of defects, but reasonable heuristics can often be used to approximately decorrelate these errors to produce a graphical decoding problem. This decorrelation works well for the surface code. However, more general codes cannot be decorrelated and require a non-matching decoder. Even when decorrelation approximations are possible, logical fidelities can be improved by using a nonmatching decoder that accounts for this correlation information.

Here it is disclosed how sliding and parallel window methods generalise to circuit-level noise and nonmatching decoding problems. In circuit-level noise, there may be a decoding problem where that include so-called hook errors, which can be represented by additional edges that are neither solely horizontal or vertical, but instead diagonal in an otherwise cubic graph. For non-matching decoding problem, there exist possibilities of hyperedges in the decoding problem. That is, given an error E, the associated hyperedge is simply a list of all the defects it triggers should the error occur. If this list of defects contains more than 2 elements, it can be referred to as a hyperedge. To extend the present methods, it is possible to partition the all the hyperedges into sets of commit regions. Two commit regions can be marked the same color (and therefore part of the same layer) provided that there is no vertex/defect contained in hyperedges from both sets.

For buffer region, it is possible to follow the same recipe as the matching case. One simply replaces the notion of graph distance with a similar hypergraph metric. The difference between rough and smooth boundaries needs care. Wherever there is a rough boundary (extremal hyperedges in a buffer region that are not adjacent to any previously corrected/committed regions), it is necessary to allow for the possibility of creating artificial defects. This can be achieved by connecting every hyperedge on a rough boundary to the boundary vertex.

APPENDIX 4: SLIDING WINDOW DECODING

In FIG. 8 results 800 confirm that the sliding window algorithms as defined in the main text have a negligible drop in logical fidelity for $n_W$=2d, $n_{com}$=d when compared to the global MWPM decoder. Further results 802 record the decoding frequency as a function of code size for square rotated planar codes. As the code size grows, the decoding frequency is expected to reduce as O(1/poly(d)) for both MWPM and UF which is consistent with this data. Therefore, using the sliding window approach combined with any of the leading decoding algorithms, there will always be a code distance for which $\tau_W > n_{com}\tau_{rd}$. This sets a limit on the distance up to which error correction codes can scale using sequential decoding.

In more detail, FIG. 8 shows logical error rate and decoding frequency on rotated planar code using sliding window MWPM decoder, and parallel window decoder with union-find under phenomenological Pauli noise with 2% physical error rate. Logical error rates as a function of the number of rounds of syndrome extraction for different code sizes for the global MWPM (lines) 800, and using the sliding window MWPM decoder (points) are shown. The decoding frequency as a function of the code size d for square rotated planar codes using a sliding window MWPM decoder 802 is shown. Logical error rates as a function of the number of rounds for global UF (lines) and using the parallel window algorithm with UF inner decoder (points) 804 are shown. The decoding frequency as a function of the number of decoding processes for the parallel window UF algorithm 806 is also shown. Where error bars are not visible, they are smaller than the marker size. Here the plot 806 shows the decoding frequency $r_{dec}$, therefore the rate of syndrome processing is $r_{proc}=r_{dec}(d^2-1)$

APPENDIX 5: UNION FIND PARALLEL WINDOW

Further to MWPM analysis in the main text, it is possible to compare the logical fidelity of UF global and parallel window decoders. Similarly, as with MWPM, no significant increase of the logical error rate is seen when using the parallel window methodology and a roughly linear increase with the number of processes occurs for large codes. However, in the case of smaller codes the decoding problem is relatively easy and there are diminishing returns with increased parallelism as the parallelization overheads in Python start being comparable with the decoding time of individual windows.

Sending data to a worker process, starting the decoding of a window and receiving the resulting data takes a finite amount of time $\tau_0$. Therefore, if $N_{par}\tau_0 > \tau_W$ all parallel processes will never be fully utilized and the processing will be bottle-necked by these overheads. However, in a hardware decoder, $\tau_0$ is expected to be below 10 ns using modern hardware and syndrome compression techniques, allowing the possibility to scale to over 100 processes. As separate processes do not need to share data, further parallelization of data communication is possible, allowing for even higher bandwidths.

APPENDIX 6: DECODING PIPELINE

Figure 9:
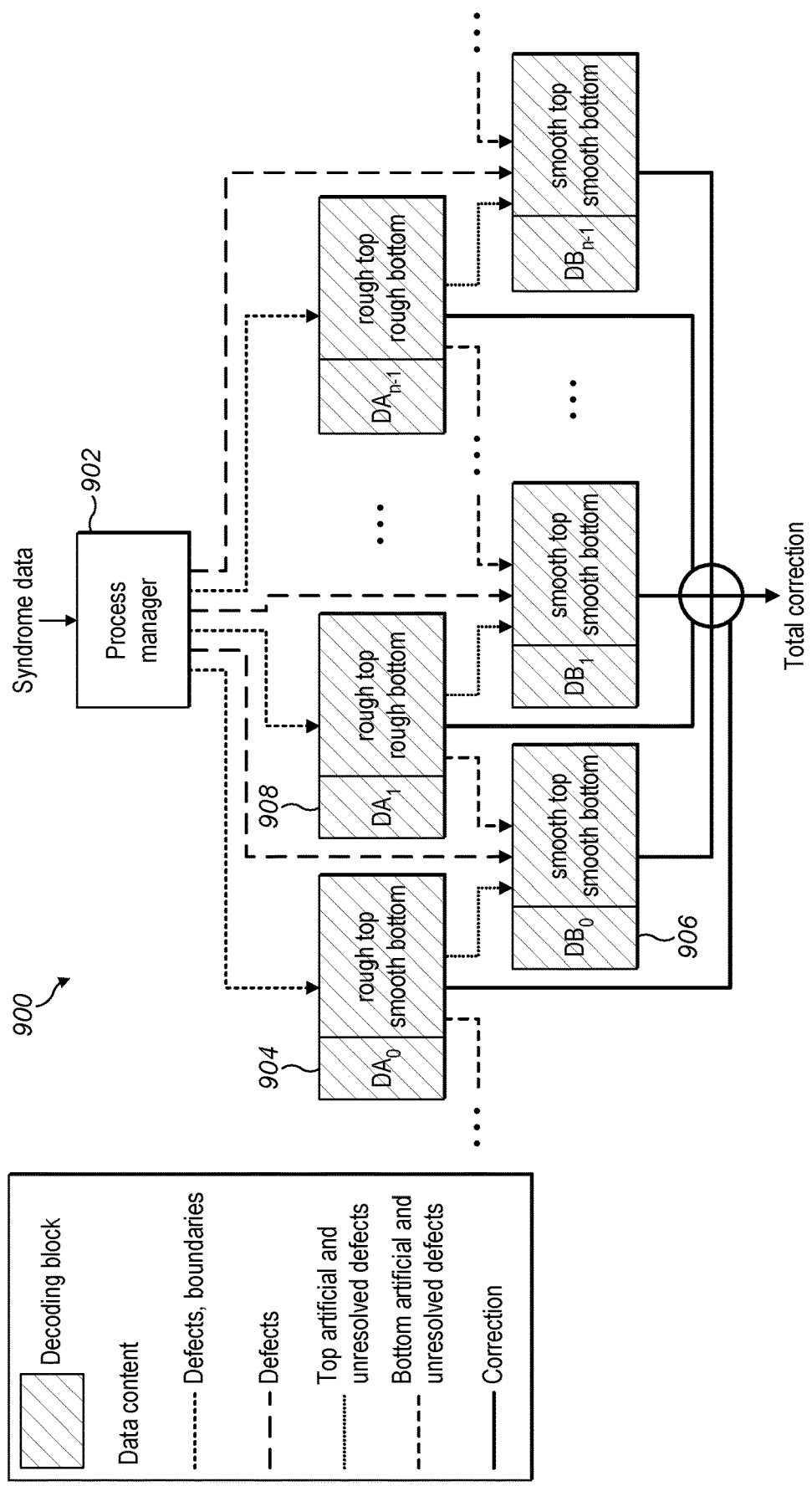
FIG. 9 shows an example embodiment of a hardware decoding apparatus for performing parallel window decoding.

FIG. 9 shows a data-flow 900 of the parallel window decoder with 2n processes that could be implemented in hardware. As the stream of syndrome data is acquired, it is given to the process manager 902 that is in charge of passing the data to the appropriate decoding block. Each decoding block resolves the 3d (or any other suitable number) rounds of defects given to it using a matching decoder of choice, and a given specification of rough time boundaries. The $DA_i(DB_i)$ blocks decode windows $A_{i \bmod n}$ ($B_{i \bmod n}$) and have rough (smooth) time boundaries. The exceptions are the first and the last blocks of computation whose boundaries depend on the initialized state and the basis of measurement.

When the first 3d rounds have been collected, these are sent to block $DA_0$ 904 for decoding, together with the bottom boundary-type information. The next d rounds are given to $DB_0$ block 906 which has to wait for $DA_0$ 904 and $DA_1$. 908 to finish before starting, followed by 3d rounds for block $DA_1$ 908 and continuing until all blocks are running. Once $DA_i$ finished decoding, it sends the artificial defects and unresolved syndromes from the bottom d rounds to $D_{i-1}$, and from the top d rounds to $DB_i$. The indices are cyclic with period n, meaning that $DB_{-1}=DB_{n-1}$, and $DA_{n-1}$ block is followed by $DA_0$ 904. When the data from $DA_i$ and $DA_{i+1}$ has been received, the $DB_i$ block can start decoding. The committed corrections from all blocks are added together, continuously updating the total correction.

The content of the data lines is as described in the legend on the left of FIG. 9. All decoding blocks implement a matching algorithm on 3d rounds with specified time boundaries. The process manager 902 can control the time boundaries of $D_A$, blocks to match the global initial and final rounds. The blocks are connected cyclically as the line going from $DA_0$ 904 to the left is connected to the line to $DB_{n-1}$ coming from the right.

As mentioned above, the data-flow can be implemented in hardware as an apparatus. The blocks, such as $DA_0$ 904, can be called block decoders. The hardware process manager would be designed to receive syndrome measurement data from a quantum computer. The process manager then identifies a plurality of primary blocks of the syndrome measurement data. The primary blocks correspond to layer A and the first blocks discussed above. Neighbouring primary blocks need to be separated by interstitial blocks. Each primary block has both a a first central block of quantum error corrections rounds and a first buffer block of quantum error correction rounds The first buffer block surrounds the first central block to create a buffer of error correction rounds from the interstitial rounds. The process manager sends each one of the primary blocks to a respective block decoder and each one of the interstitial blocks to a respective block decoder keeping track of which blocks have been sent to which block decoders to maintain co-ordination.

Each block decoder with a primary block is configured to identify the location of errors in the plurality of qubits by decoding the respective primary block to provide a respective decoded first central block and a respective decoded first buffer block. Having does, the block decoder can then provide the location of the errors in the decoded first central block to an output. Then the block decoder can provide at least a first part of the decoded first buffer block that it has just produced to the appropriate block decoder with the relevant interstitial block immediately preceding the respective primary block and provide a second part of the decoded first buffer block to whichever block decoder has the interstitial block immediately succeeding the respective primary block.

The block decoders with the interstitial block, once they have received the appropriate tentatively decoded buffer block can then proceed to combine them with the interstitial block to form a secondary block (which corresponds to the layer B windows and second blocks discussed above in relation to FIGS. 3 and 4, and then decode the secondary block. Locations of errors in the secondary block can then be provided to an output. If only 2 layers of decoding are required, then this completes the process. However, if further layers are needed then the apparatus can continue until the complete code has been decoded, as discussed above, and then quantum error correction for the quantum computer becomes possible.

Figure 10:
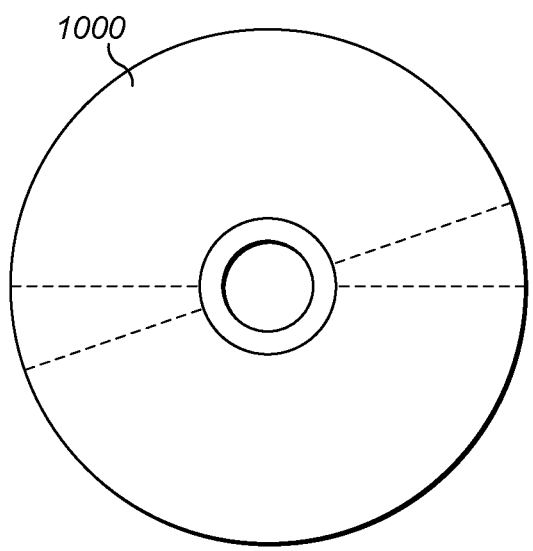
FIG. 10 shows an example embodiment of a computer program product.

FIG. 10 shows a computer program product 1000 (or equivalently a computer readable memory medium) that contains computer code instructions that can configure a decoder apparatus (either within or separate from a quantum computer) to perform any method disclosed herein.

The invention claimed is:

1. A computer-implemented method for decoding syndromes of a quantum error correction code, the syndromes comprising measurement data from a quantum computer, the method comprising:
   receiving syndrome measurement data comprising a plurality of quantum error correction rounds performed on a plurality of qubits;
   identifying a plurality of non-overlapping first blocks within the syndrome measurement data, wherein:
      each first block has:
         a first central block of quantum error corrections rounds; and
         a first buffer block of quantum error correction rounds, wherein the first buffer block surrounds the first central block, and
      each first block is surrounded by an interstitial region of quantum error correction rounds;
   identifying the location of a first set of errors in the plurality of qubits by decoding each first block to provide respective decoded first central blocks and respective decoded first buffer blocks;
   outputting the location of the first set of errors contained within each decoded first central block.

2. The method of claim 1, wherein two or more of the first blocks are decoded in parallel.

3. The method of claim 1, further comprising:
   identifying the location of a second set of errors in the plurality of qubits by decoding a plurality of second blocks, wherein each second block comprises:
      a first interstitial block of the interstitial region; and
      at least part of the decoded first buffer block of each first block immediately adjacent to the interstitial block;
   outputting the location of the second set of errors contained within each second block.

4. The method of claim 3, wherein two or more of the second blocks are decoded in parallel.

5. The method of claim 3, wherein the plurality of first central blocks together with the plurality of second blocks provide a tessellation of the quantum error correction code.

6. The method of claim 3, wherein each first buffer block comprises at least a number of quantum error correction rounds, between an adjacent first central block and an adjacent first interstitial block, at least equal to half a code distance of the quantum error correction code.

7. The method of claim 3, wherein:
   the second blocks further comprise second buffer regions that extend into adjacent second interstitial blocks of the interstitial region, wherein nearest neighbour second blocks are separated by the second interstitial blocks;
   a second central block of each respective second block comprises the respective first interstitial block and the at least part of the decoded first buffer block of each first block immediately adjacent to the respective interstitial block, each second central block being surrounded by each immediately adjacent first central block and the second buffer regions;
   the second set of errors are contained within each second central block.

8. The method of claim 7, further comprising:
   identifying locations of a third set of errors by decoding the second interstitial blocks; and
   outputting the locations of the third set of errors.

9. The method of claim 8, wherein the plurality of first central blocks, the plurality of second central blocks and the plurality of second interstitial blocks, together provide a tessellation of the quantum error correction code.

10. The method of claim 9, wherein the tessellation of the quantum error correction code is three-colorable, such that:
    zero pairs of the first central blocks share a boundary;
    zero pairs of the second central blocks share a boundary; and
    zero pairs of the second interstitial blocks share a boundary.

11. The method of claim 10, wherein:
    each first central block is a regular hexagon and the plurality of first central blocks form a first regular hexagonal array;
    each second central block is a regular hexagon and the plurality of second central blocks form a second regular hexagonal array; and
    each second interstitial block is a regular hexagon and the plurality of second interstitial blocks form a third regular hexagonal array.

12. The method of claim 9, wherein:
    the plurality of first central blocks, the plurality of second central blocks and the plurality of second interstitial blocks provide a three-colorable tiling of a two-dimensional boundary of the quantum error correction code; and
    each of the plurality of first central blocks, each of the plurality of second central blocks and each of the plurality of second interstitial blocks extend from the boundary in a third orthogonal dimension to provide a three-colorable tessellation of the quantum error correction code.

13. The method of claim 8, further comprising:
    identifying the location of a third set of errors in the plurality of qubits by decoding a plurality of third blocks, wherein each third block comprises:
       a respective second interstitial block of the interstitial region; and
       at least part of the decoded buffer region of each second block immediately adjacent to the respective second interstitial block;
    outputting the location of the third set of errors contained within each third block.

14. The method of claim 13, wherein:
    the third blocks further comprise third buffer regions that extend into adjacent third interstitial blocks of the interstitial region, wherein nearest neighbour third blocks are separated by the third interstitial blocks;
    a third central block of each respective third block comprises the respective second interstitial block and the at least part of the decoded buffer region of each second block immediately adjacent to the respective second interstitial block, each third central block being surrounded by each immediately adjacent first central block and second central block and the third buffer regions;
    the third set of errors are contained within each third central block.

15. The method of claim 14, further comprising:
identifying locations of a fourth set of errors by decoding the third interstitial blocks; and
outputting the locations of the fourth set of errors.

16. The method of claim 15, wherein the plurality of first central blocks, the plurality of second central blocks, the plurality of third central blocks and the plurality of third interstitial blocks, together provide a four-colorable tessellation of the quantum error correction code.

17. An apparatus for decoding syndromes of a quantum error correction code, the apparatus comprising:
a plurality of block decoders;
a process manager configured to:
receive syndrome measurement data comprising a plurality of quantum error correction rounds performed on a plurality of qubits of a quantum computer;
identify a plurality of primary blocks of the syndrome measurement data, wherein neighbouring primary blocks are separated by interstitial blocks of quantum error correction rounds, each primary block comprising:
a first central block of quantum error corrections rounds; and
a first buffer block of quantum error correction rounds, wherein the first buffer block surrounds the first central block;
provide each one of the primary blocks to a respective block decoder of the plurality of block decoders and each one of the interstitial blocks to a respective block decoder of the plurality of block decoders,
wherein each respective block decoder provided with a respective primary block is configured to:
identify the location of errors in the plurality of qubits by decoding the respective primary block to provide a respective decoded first central block and a respective decoded first buffer block;
provide the location of the errors in the respective decoded first central block to an output;
provide at least a first part of the respective decoded first buffer block to the respective block decoder with the particular interstitial block immediately preceding the respective primary block;
provide at least a second part of the decoded first buffer block to the respective block decoder with the particular interstitial block immediately succeeding the respective primary block.

18. The apparatus of claim 17, wherein each respective block decoder provided with a specific interstitial block is configured to:
combine the specific interstitial block with the provided first part of the respective decoded first buffer block and the provided second part of the respective decoded first buffer block to form a respective secondary block;
identify the location of further errors in the plurality of qubits by decoding the respective secondary block;
provide the location of the further errors to the output.

19. A quantum computer system comprising the apparatus of claim 18.

20. A computer program product comprising instructions that, when executed by a processor, perform the method of claim 1.

* * * * *